US005455679A

United States Patent [19]

Houryu et al.

[11] Patent Number: 5,455,679
[45] Date of Patent: Oct. 3, 1995

[54] POSITION DETECTING SYSTEM

[75] Inventors: Sakae Houryu, Hachiohji; Kenji Saitoh, Atsugi, both of Japan

[73] Assignee: Canon Kabushiki Kaisha, Tokyo, Japan

[21] Appl. No.: 384,221

[22] Filed: Feb. 6, 1995

Related U.S. Application Data

[63] Continuation of Ser. No. 20,377, Feb. 22, 1993, abandoned.

[30] Foreign Application Priority Data

Feb. 21, 1992 [JP] Japan ................................ 4-072234

[51] Int. Cl.$^6$ ................................ G01B 11/27; G01N 21/86
[52] U.S. Cl. ................................ 356/401; 356/375; 250/548
[58] Field of Search ................................ 356/401, 375; 250/548

[56] References Cited

U.S. PATENT DOCUMENTS

| | | | |
|---|---|---|---|
| 4,037,969 | 7/1977 | Feldman et al. | 356/172 |
| 4,311,389 | 1/1982 | Fay et al. | 356/354 |
| 4,326,805 | 4/1982 | Feldman et al. | 356/399 |
| 5,114,235 | 5/1992 | Suda et al. | 356/401 |
| 5,114,236 | 5/1992 | Matsugu et al. | 356/401 |
| 5,148,035 | 9/1992 | Hattori et al. | 356/401 |
| 5,148,036 | 9/1992 | Matsugu et al. | 356/401 |
| 5,148,037 | 9/1992 | Suda et al. | 250/548 |
| 5,225,892 | 7/1993 | Matsugu et al. | 356/401 |
| 5,227,862 | 7/1993 | Oshida et al. | 356/363 |
| 5,235,408 | 8/1993 | Matsugu et al. | 356/401 |
| 5,325,176 | 6/1994 | Suda et al. | 356/401 |

FOREIGN PATENT DOCUMENTS 0157033 12/1981 Japan.
0226003 11/1985 Japan.

Primary Examiner—Robert P. Limanek
Assistant Examiner—Alexander Oscar Williams
Attorney, Agent, or Firm—Fitzpatrick, Cella, Harper & Scinto

[57] ABSTRACT

A position detecting system includes a light source for producing a light beam for irradiating a reference mark formed on an object which is relatively displaceable relative to the light beam, a detector for detecting a light quantity distribution of the light from the reference mark, and a circuit for comparing a first light quantity distribution at a first position with a second light quantity distribution at a second position spaced from the first position by a predetermined distance, and for determining a reference position of the object on the basis of the comparison.

6 Claims, 9 Drawing Sheets

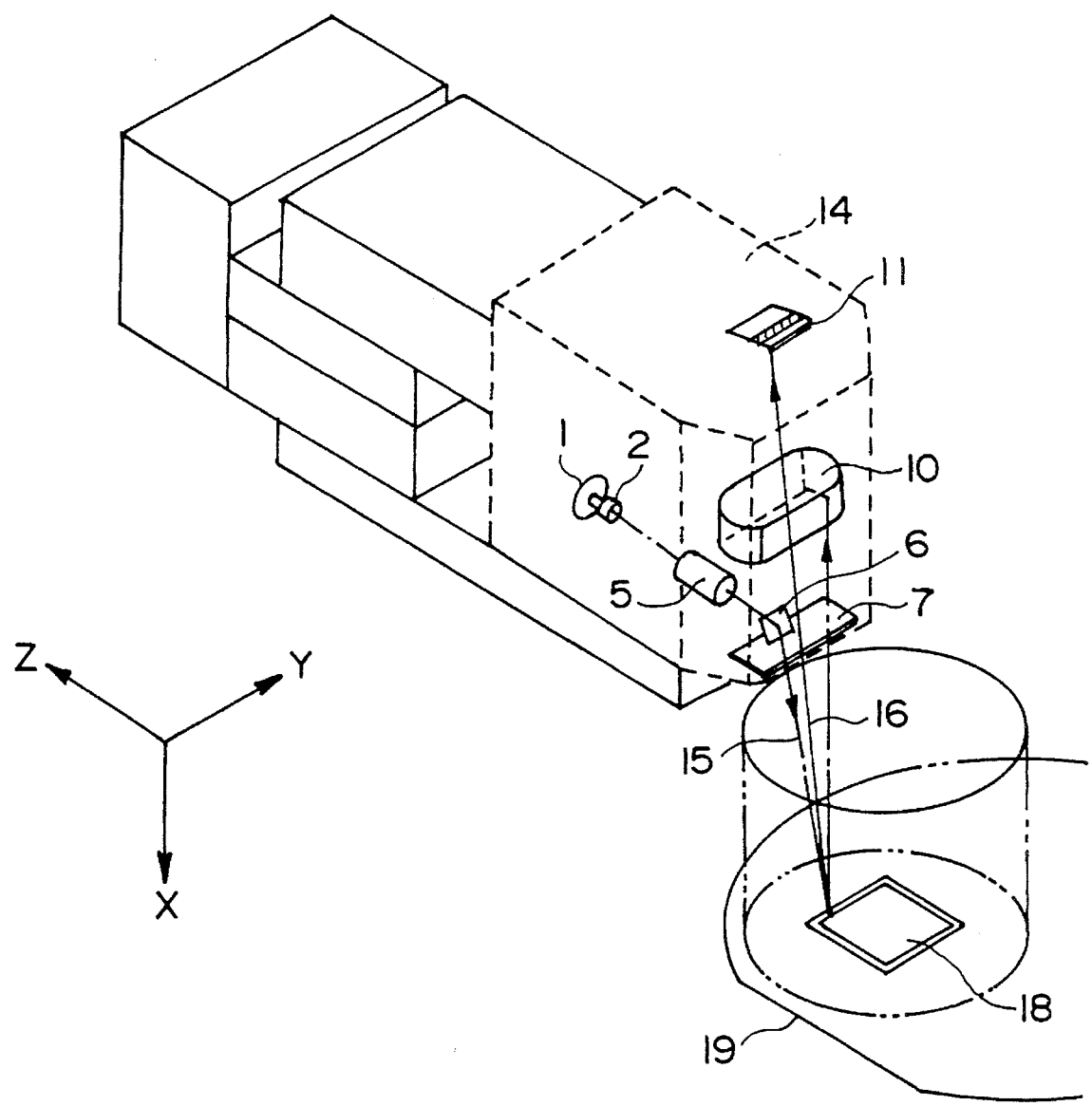
F I G. 1

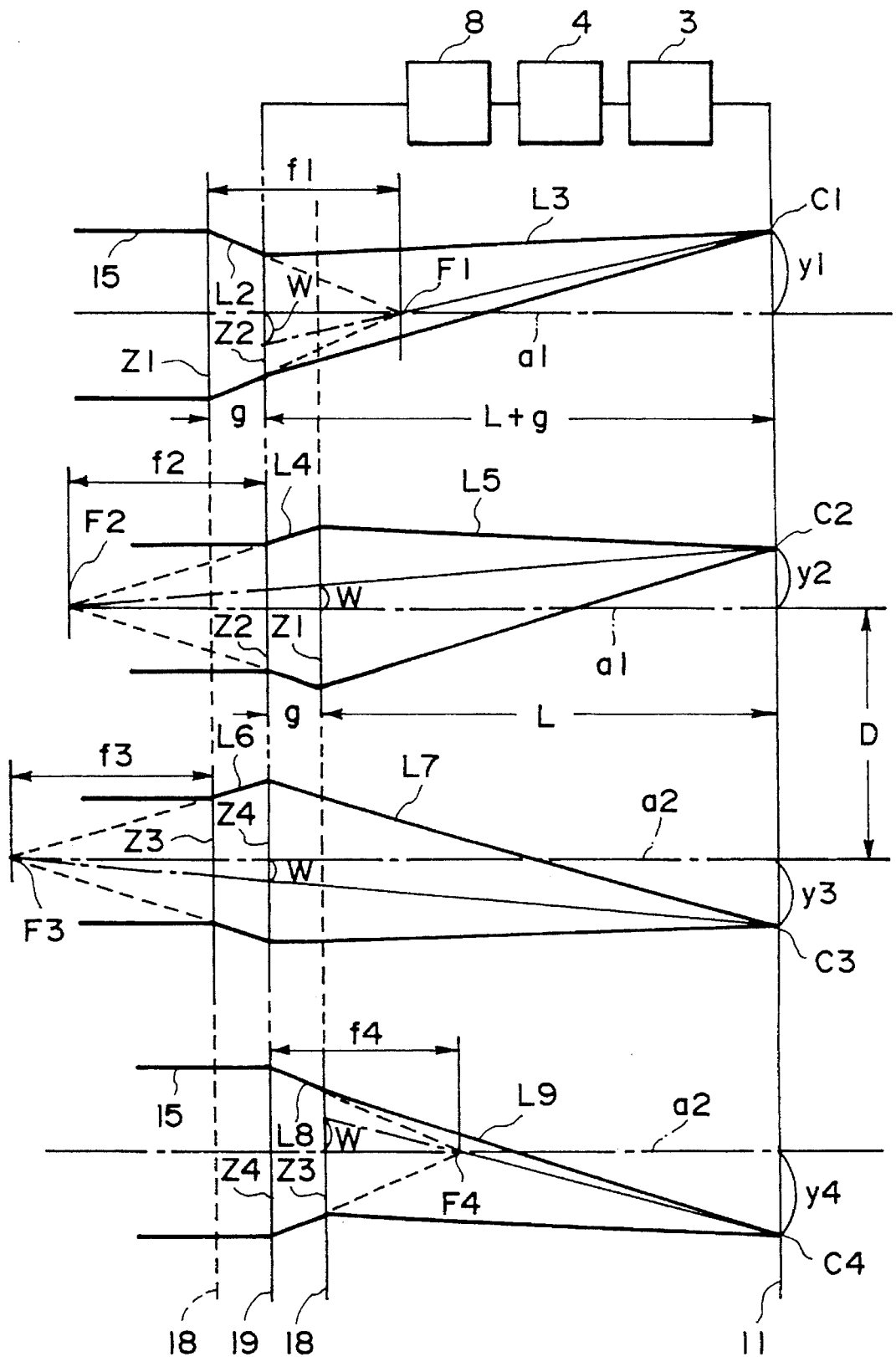
F I G. 4

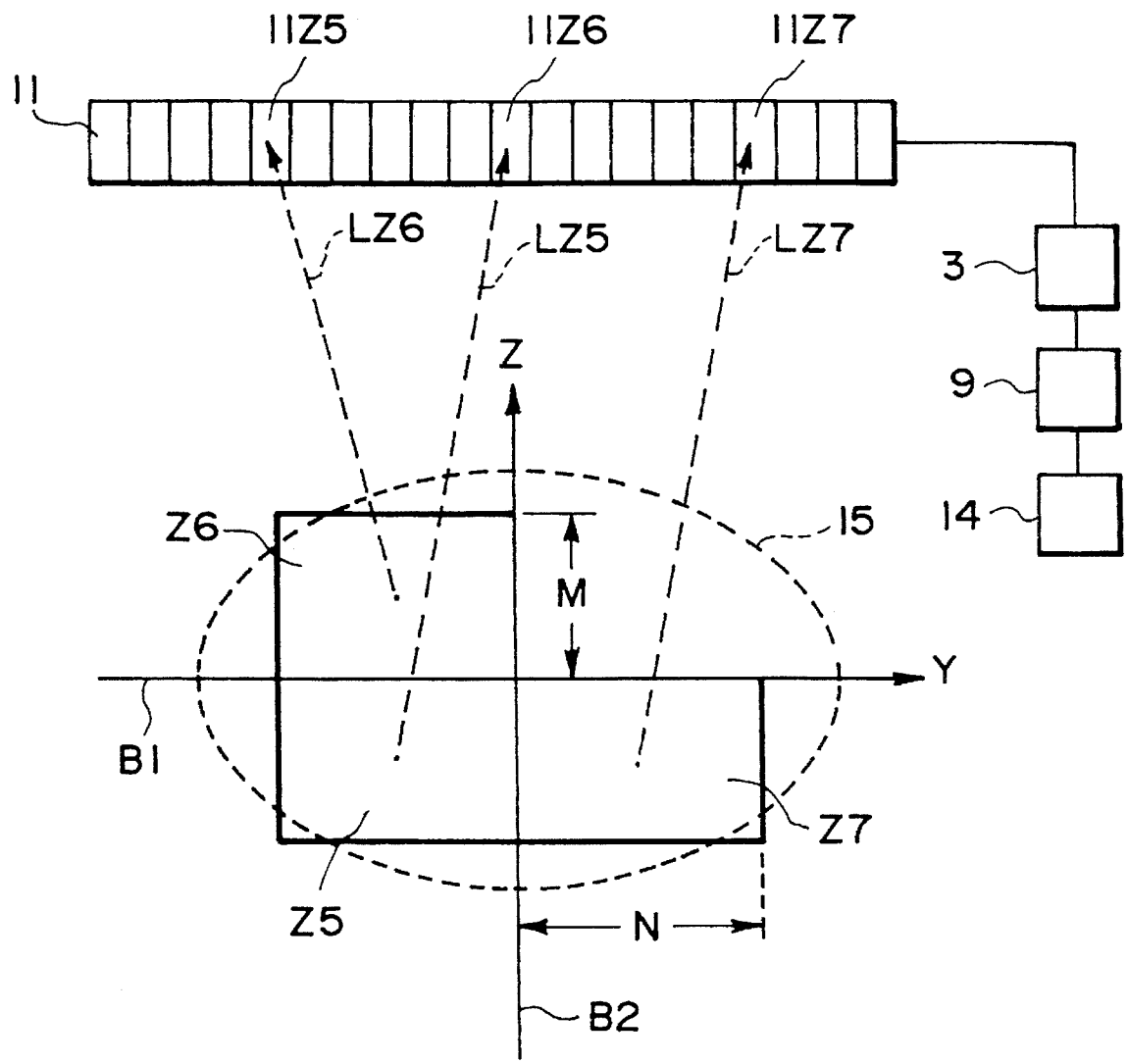
F I G. 6

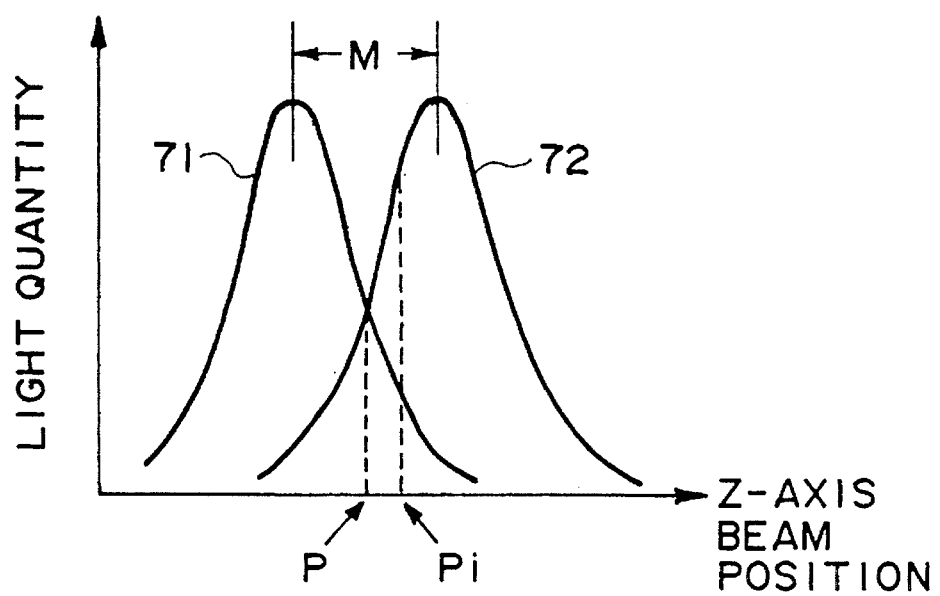
F I G. 7
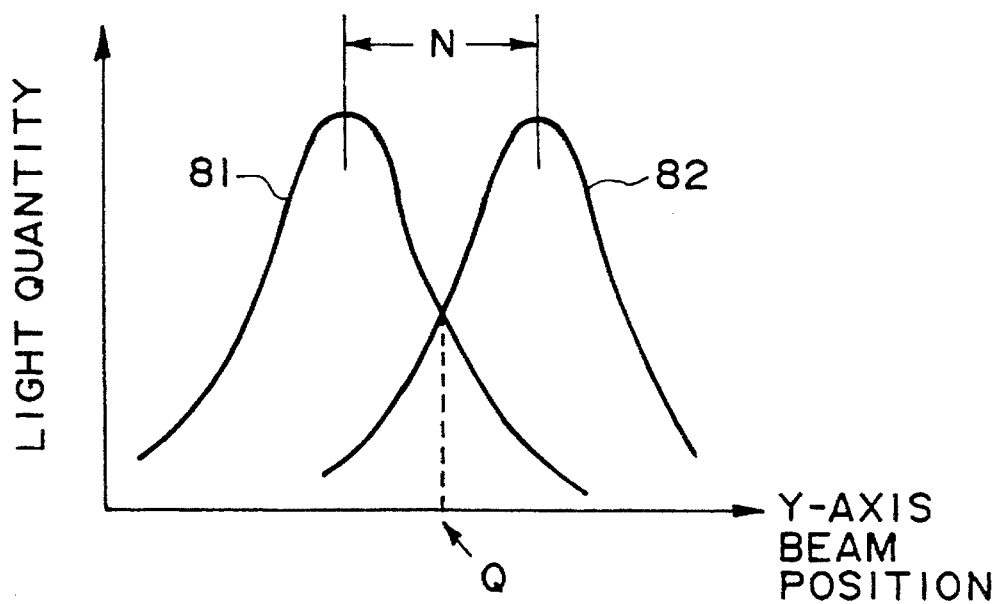
F I G. 8

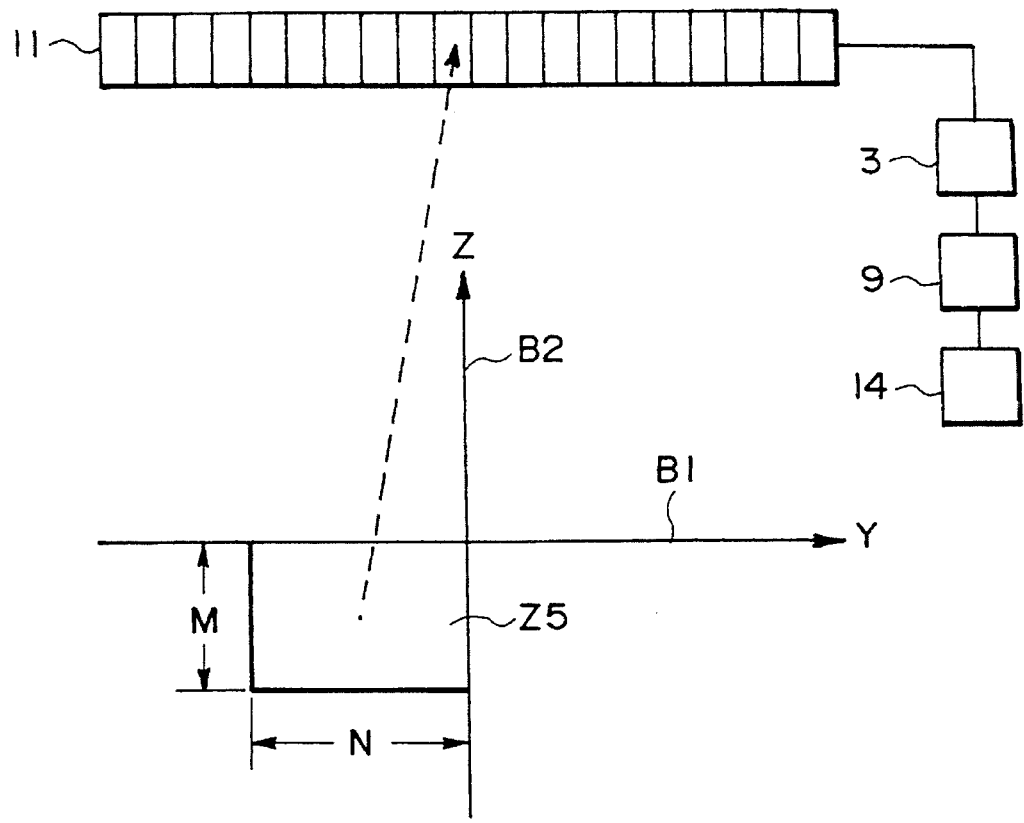
F I G. 9
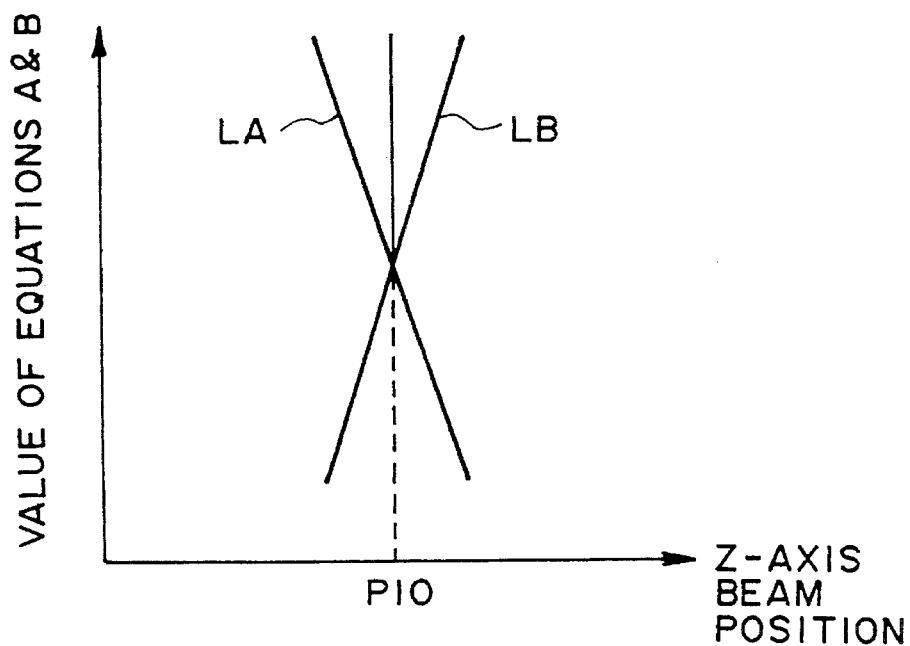
F I G. 10

POSITION DETECTING SYSTEM

This application is a continuation of prior application, Ser. No. 08/020,377 filed Feb. 22, 1993, now abandoned.

FIELD OF THE INVENTION AND RELATED ART

This invention relates to a position detecting system. More particularly, the invention is concerned with a position detecting system suitably usable, for example, in a proximity type or stepper type exposure apparatus for the manufacture of semiconductor devices, for relatively positioning or aligning a first object such as a mask or reticle (hereinafter, simply a "mask") and a second object such as a wafer in an occasion where a fine electronic pattern formed on the first object is to be lithographically transferred to the second object.

In exposure apparatuses for the manufacture of semiconductor devices, the relative alignment of a mask and a wafer is one important factor for ensuring improved performance. Particularly, as for alignment systems employed in recent exposure apparatuses, submicron alignment accuracies or more strict accuracies are required in consideration of the demand for higher degrees of integration of each semiconductor device.

In many types of alignment systems, features called an "alignment pattern" or "alignment marks" are provided on a mask and a wafer along their scribe lines and, by utilizing positional information obtainable from these patterns, the mask and the wafer are aligned. As for the manner of executing the alignment, examples are disclosed in U.S. Pat. No. 4,037,969 and Japanese Laid-Open Patent Application, Laid-Open No. 157033/1981 wherein so-called zone plates are used as alignment patterns upon which light is projected and wherein the positions of light spots formed on a predetermined plane by lights from the illuminated zone plates are detected.

U.S. Pat. No. 4,311,389 discloses another example wherein a mask has a diffraction alignment pattern with an optical function like a cylindrical lens while a wafer has a dot-array alignment pattern which provides a predetermined order diffraction light of maximum light quantity in response to the alignment of the mask and the wafer. By detecting light from these alignment patterns, the relative position of the mask and the wafer is detected.

Japanese Patent Application No. 226003/1985 filed in Japan in the name of the assignee of the subject application discloses another example wherein, for detection of relative positional deviation between a mask (first object) and a wafer (second object), two sets of physical optic elements (alignment marks) having lens functions are provided on the first and second objects and wherein light is projected to these physical optic elements from light projecting means which includes a laser. Diffraction light diffracted successively by these physical optic elements is directed to a sensor (detecting means), and any relative positional deviation between the first and second objects is determined by detecting the spacing between two light spots on the sensor.

The light projecting means is accommodated in a single casing, together with the detecting means for receiving the light diffracted successively by the two sets of physical optic elements on the two objects.

SUMMARY OF THE INVENTION

Generally, a scribe line on a mask or a wafer along which alignment marks are formed has a width of about 50–100 microns. In a stepper having a projection magnification of 5×, the width of such scribe line is 250–500 microns on the surface of a reticle. It is 50–100 microns in an X-ray unit-magnification contact exposure (proximity) apparatus. The alignment marks are formed within such an area (scribe line width).

In order to assure that light (light beam) from an alignment head (light projecting means) is projected efficiently onto an alignment pattern formed in such a small area, the diameter of the light has to be reduced to a size corresponding to the size of the alignment pattern. Also, as regards the manner of light projection, the light has to be projected accurately and correctly to the alignment pattern.

Generally, if the light is incorrectly projected to an alignment pattern, the quantity of light (signal light) detected by a sensor reduces correspondingly. If the light has a sufficiently large diameter relative to the size of the alignment pattern, the light may be projected with an approximately uniform light quantity distribution to the alignment pattern.

However, projecting the light with a uniform light quantity distribution necessarily results in irradiation of a circuit pattern area outside the alignment pattern area. Consequently, unwanted light comes back from the circuit pattern, as noise. In order to prevent this, the alignment pattern has to be illuminated with light of a size corresponding to the size of the alignment pattern.

If, however, the diameter of the light is restricted, the light quantity distribution on the alignment pattern on the mask (reticle) surface becomes non-uniform.

Further, if the position of light projected to the alignment pattern shifts largely, the position of a light spot (representing the positional deviation of the mask and the wafer) formed by the diffraction light from the alignment pattern, on an occasion when the mask and the wafer has a deviation of some degree, differs from the position of the light spot to formed when the light is correctly projected to the alignment pattern. Namely, the error of the position of light projected to the alignment pattern causes an error in the alignment detection.

It is therefore necessary to assure precise positioning of the light beam (light projecting means) and the alignment mark (on the first or second object) and to provide a proper light beam diameter, for enhanced alignment precision. However, an attempt to assure high precision in the positioning of the light beam to the alignment mark only by some mechanical means easily leads to complicatedness and bulkiness of the structure and a difficulty in maintaining the stableness for a long period.

It is accordingly an object of the present invention to provide a position detecting system by which a certain reference position of an object can be detected very easily.

It is another object of the present invention to provide a high-precision exposure apparatus or a high-precision semiconductor device manufacturing apparatus based on such a high-precision position detecting system.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a schematic view of a portion of a first embodiment of the present invention.

FIG. 4 is a schematic view for explaining the principle of position detection in the present invention.

FIG. 6 is a schematic view for explaining the principle of detecting the relative position of light projecting means and a first object.

FIG. 7 is a graph for explaining the principle of detecting the relative position of light projecting means and a first object.

FIG. 8 is a graph for explaining the principle of detecting the relative position of light projecting means and a first object.

FIG. 9 is a schematic view for explaining another embodiment, for detecting the relative position of light projecting means and a first object.

FIG. 10 is a graph for explaining another embodiment, for detecting the relative position of light projecting means and a first object.

DESCRIPTION OF THE PREFERRED EMBODIMENTS

Figure 2:
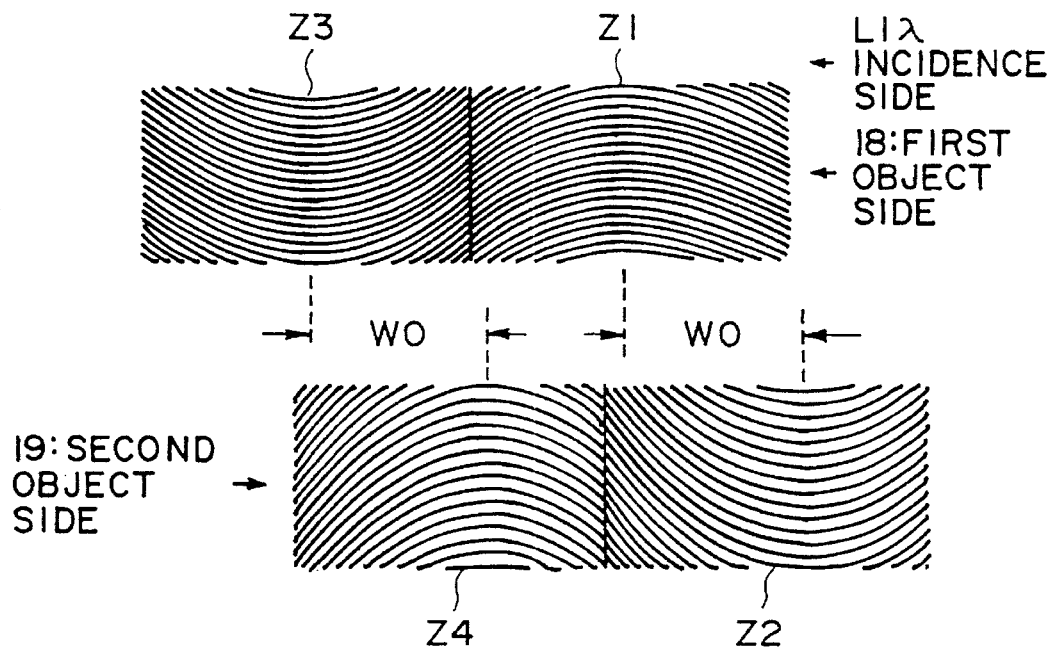
FIG. 2 is an enlarged view for explaining a portion of FIG. 1.

Referring to FIG. 1, the principle of detection of the relative position of a first object and a second object will first be explained.

Denoted in FIG. 1 at 1 is a light source which may comprise a semiconductor laser, a He-Ne laser or an Ar laser, for example, for providing coherent light, a light source such as a light emitting diode for providing incoherent light or an X-ray light source. Denoted at 2 is a collimator lens for transforming the light from the light source into parallel light which is then projected to a lens system 5. The lens system 5 transforms the received light into light of a desired beam diameter. After being reflected by a mirror 6, the light passes through an optical window 7 (X-ray resistive window when an X-ray light source is used) and projected on autoalignment marks (each hereinafter referred to as an "AA mark") Z1 and Z3 (see FIG. 2) which are provided on a mask (first object) 18 for detection of positional deviation. The light source 1, the collimator lens 2 and the lens system 5 cooperate to define light projecting means.

Additionally, on the mask 18 surface, there are provided reference marks (light quantity detecting masks) Z5, Z6 and Z7 (see FIG. 6), for detection of the relative position of the light projecting means and the mask (first object) 18, as will be described later.

The AA marks Z1 and Z3 and the reference marks Z5–Z7 are placed at four locations on scribe lines of the mask 18, in a peripheral portion thereof. Denoted at 19 is a wafer (second object) which is placed parallel to and in proximity (with a gap of 10–100 microns) to the mask 18. The wafer has AA marks Z2 and Z4 to be aligned with the mask 18, which are formed on scribe lines thereof. The AA marks Z1–Z4 and the reference marks Z5–Z7 each comprises a physical optic element such as a one- or two-dimensional zone plate, for example.

Denoted at 10 is a light receiving lens which serves to collect diffraction light 16 of a predetermined order or orders, passed through the AA marks on the mask 18, to the surface of a sensor (detecting means) 11. Denoted at 14 is an alignment head which can be driven by a driving means (not shown).

Figure 3:
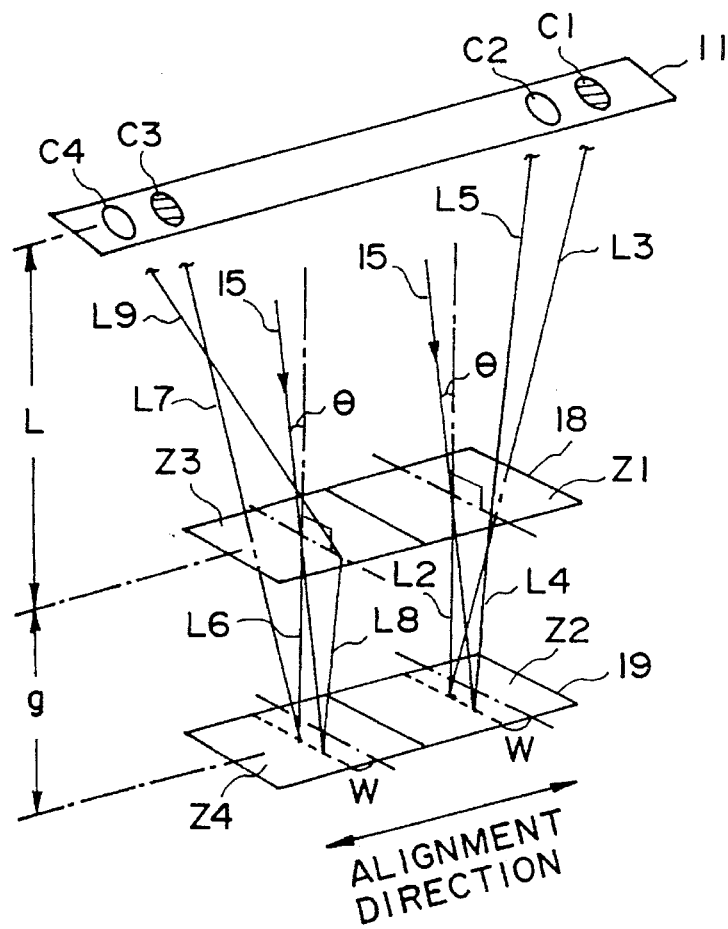
FIG. 3 is a schematic view for explaining a portion of FIG. 1.

FIG. 2 illustrates the AA marks Z1–Z4 which are provided on the mask (first object) 18 and the wafer (second object) 19. FIG. 3 illustrates the paths of lights passed through the marks of the mask 18 and the wafer 19. FIG. 4 illustrates the light paths of FIG. 3 in an expanded view.

In FIGS. 3 and 4, denoted at 15 are lights from a light source (not shown) such as a semiconductor laser, an LED or an X-ray light source, for example. These lights are incident on the AA marks Z1 and Z3 on the mask (first object) 18 surface, each at an angle θ. The wafer (second object) 19 is disposed opposed to the first object 18, with a spacing g. Reference character W denotes the relative deviation between the first and second objects 18 and 19. The marks Z1 and Z3 comprise first and third physical optic elements of transmission type, which are provided on the surface of the first object 18. The lights 15 are projected on the AA marks Z1 and Z3. Denoted at Z2 and Z4 are second and fourth physical optic elements of reflection type (being illustrated as transmission type in FIG. 4) which are provided on the surface of the second object 19.

The AA marks Z1–Z4 have lens functions, with focal points F1–F4 and focal lengths f1–f4, respectively. Denoted at L2–L9 are diffraction lights of predetermined orders, from these physical optic elements. Denoted at 11 is a detecting means which may comprise a sensor such as a line sensor or an area sensor, disposed at a distance L from the first object 1. Reference characters a1 and 12 denote optical axes of the AA marks Z1 and Z3, respectively, which are spaced from each other by a distance D.

Points C1–C4 correspond to the gravity center positions of diffraction lights L3, L5, L7 and L9 on the sensor 11 surface. Of these points, the points C1 and C2 are spaced from the optical axis a1 by distances y1 and y2, respectively. The points C3 and C4 are spaced from the optical axis a2 by distances y3 and y4, respectively.

Here, the term "gravity center of light" means such a point that, when in the cross-section of the light a position vector of each point in the section is multiplied by the light intensity at that point and the thus obtained products are integrated over the entire section, the integrated level has a "zero vector".

Denoted at 3 is a signal processing circuit (computing means) which serves to detect the gravity centers of the lights L3, L5, L7 and L8 on the basis of the information from the sensor 11, and also to determine the positional deviation W, if any, and the spacing g between the first and second objects 1 and 2 on the basis of the distances y1–y4 and D, for example. Denoted at 4 is a control circuit for controlling the positional deviation W and the spacing g between the first and second objects 18 and 19 in accordance with the information from the signal processing circuit 3 about the deviation W and spacing g. Denoted at 8 is a stage controller for driving a stage (not shown), on which the second object 19 is placed, in accordance with a signal from the control circuit 4.

In this embodiment, the lights 15 from the light source are projected on the AA marks Z1 and Z3 on the first object 18. Of the light 15 incident on the AA mark Z1, first-order diffraction light L2 produced in response to the projection of the light 15 upon the AA mark Z1 impinges on the AA mark Z2, and this produces first-order diffraction light L3 having its direction of diffraction being determined in accordance with the quantity of positional deviation W. The diffraction light L3 simply goes through the AA mark Z1 as a zeroth order diffraction light, and it is imaged on the sensor 11 surface at a position spaced by a distance y1 from the optical axis a1. Since the distance between the sensor 11 and the first object 18 is constant (=L), the magnitude of the distance y1 is dependent upon the quantities of the positional deviation W and the spacing g.

On the other hand, the light 15 not influenced by the diffraction function of the AA mark Z1 but passed therethrough as a zeroth-order diffraction light impinges on the AA mark Z2. Then, first-order diffraction light L4 influenced by the first-order diffraction function of the AA mark Z2 impinges again on the AA mark Z1, and this produces first-order diffraction light L5 having its direction of diffraction being determined in accordance with the positional deviation W. The first-order diffraction light L5 is imaged on the sensor 11 surface at a position spaced by a distance y2 from the optical axis a1.

Like the light 15 projected on the AA mark Z1, diffraction lights L6–L9 are produced from the light 15 projected on the AA mark Z3. Of these diffraction lights, the diffraction lights L7 and L9 are imaged on the sensor 11 surface at positions spaced by distances y3 and y4 from the optical axis a2, respectively. The signal processing circuit 3 operates to detect the gravity center positions C1, C2, C3 and C4 of the lights L3, L5, L7 and L9 on the basis of the information received from the sensor 11, and then to calculate the spacing D14 between the points C1 and C4 as well as the spacing D23 between the points C2 and C3. On the basis of the spacings D14 and D23 and in accordance with equations to be described later, it determines the quantities of the positional deviation W and the spacing g between the first and second objects 1 and 2.

The control circuit 4 drives the stage controller 8 in accordance with the information from the signal processing circuit 3 about the deviation W and the spacing g, and moves the second object 2 to a predetermined position. It is to be noted here that this embodiment is not limited to the use of the first-order diffraction light, and that second-order or higher-order diffraction light may be used with substantially the same advantageous effects.

In this embodiment, various components such as a light source and the sensor may be disposed close to each other, and therefore the size of the alignment head can be reduced. Also, since it is not necessary to move the alignment head at the time of the exposure operation, the throughput can be enhanced.

Next, the manner of detecting the positional deviation W and the spacing g between the first and second objects 18 and 19 in this embodiment will be explained in conjunction with FIG. 4.

In FIG. 4, in the lens system which produces the diffraction light L3, the light 15 goes through the AA marks Z1 and Z2, having a lens function, and impinges on the point C. Here, the distance y1 to the gravity center C1 of the diffraction light L3 has a magnitude as determined by the deviation W and the spacing g between the first and second objects 18 and 19, and generally it can be expressed as:

$$y1=F1(W,g) \quad \ldots (1)$$

Similarly, in the remaining three lens systems, the distances y2, y3 and y4 have magnitudes as determined by the deviation W and the spacing g, and they can be expressed as:

$$y2=F2(W,g) \quad \ldots (2)$$

$$y3=F3(W,g) \quad \ldots (3)$$

$$y4=F4(W,g) \quad \ldots (4)$$

If the distances y1–y4 are such as above and if the distance D13 between the points C1 and C3 and the distance D24 between the points C2 and C4 are used, then the following two quantities Y1 and Y2 which are dependent upon the deviation W and the spacing g are given:

$$Y1=y1+y3=D13-D=F1(W,g)+F3(W,g)=F5(W,g)$$

$$Y2=y2+y3=D24-D=F2(W,g)+F4(W,g)=F6(W,g)$$

Namely, $$Y1=F5(W,g) \quad \ldots (5)$$

$$Y2=f6(W,g) \quad \ldots (6)$$

Generally, if there are two unknowns, solutions of the unknowns can be fixed if there are equations including the unknowns. Thus, if two equations such as $$A=G1(W,g) \quad \ldots (7)$$

$$B=G2(W,g) \quad \ldots (8)$$

are provided, then the unknowns W and g can be fixed by measuring the quantities A and B, for example.

Equation (1) may be rewritten by using W and g as follows:

$$y1:W=(L+2g-f1):(f1-g)$$

From this, it follows that:

$$y1=[(l+g)/(f1-g)-1]\times W \quad \ldots (9)$$

Similarly, equations (2), (3) and (4) may be rewritten as follows:

$$y2=[L/(f2+g)+1]\times W \quad \ldots (10)$$

$$y3=[(L+g)/(f3+g)+1]\times W \quad \ldots (11)$$

$$y4=[L/(f4-g)-1]\times W \quad \ldots (12)$$

On the basis of these equations, equations (5) and (6) may be rewritten as follows:

$$D13-D=\{[(L+g)/(f1-g)]+[(L+g)/(f3+g)]\}\times W \quad \ldots (13)$$

$$D24-D=\{[L/(f2+)]+[L/(f4-g)]\}\times W \quad \ldots (14)$$

In equations (13) and (14), the distance D is the spacing between the optical axes a1 and a2 and thus it is predetected. Also, the distances D13 and D24 can be detected by measurement. Therefore, the magnitudes of the positional deviation W and the spacing g can be determined from equations (13) and (14). If the deviation W is removed from equations (13) and (14), a cubic equation on the spacing g is obtained. Thus, by using this equation, the deviation W and the spacing g can be calculated easily by computation, for example.

Figure 5:
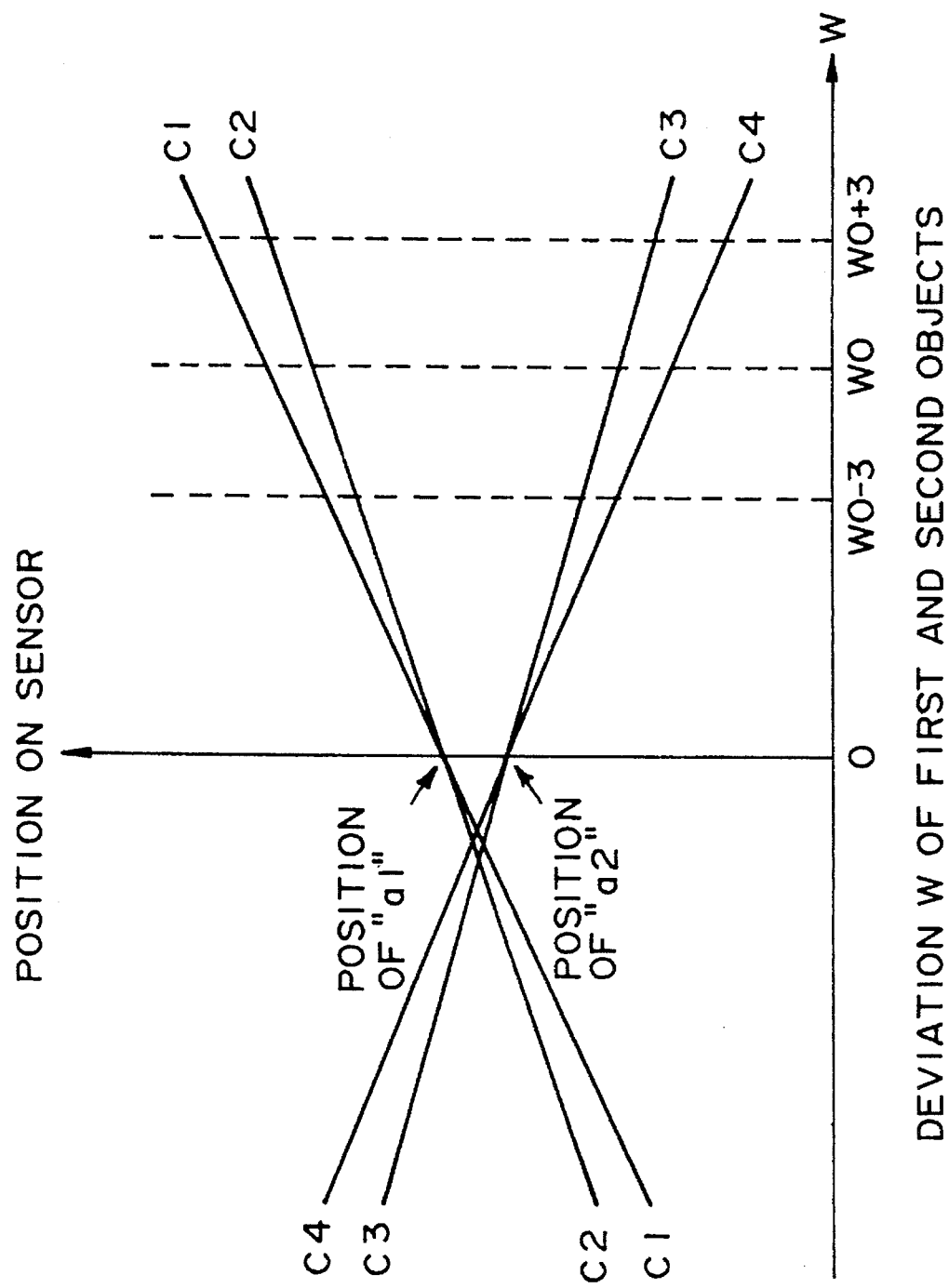
FIG. 5 is a graph for explaining the principle of position detection in the present invention.

FIG. 5 illustrates displacement of the gravity centers C1, C2, C3 and C4 of the diffraction lights L3, L5, L7 and L9 in accordance with the deviation W, in this embodiment. The diffraction lights L3, L5, L7 and L9 have certain widths, respectively, on the sensor surface, and if there is overlapping, it is difficult to detect the points C1–C4 precisely.

In consideration of this, in this embodiment, if the measurement is to be executed in the deviation range of W=±3 microns, the characteristic between the points WO-3 and WO+3 (the range in which the lights are spaced from each other) may be determined by simulation, for example, and it is used for the measurement.

More specifically, in this embodiment, the gravity center positions of first and second diffraction lights produced upon a predetermined plane by the first and second AA marks and the gravity center positions of the third and fourth diffraction lights produced on the predetermined plane by the third and fourth AA marks, are detected in the state that they are spaced by a distance greater than the width of the diffraction light.

In this embodiment, the mark setting may be such that the optical axis a1 of the AA mark (e.g. Z1) of the first object and the optical axis a2 of the AA mark (e.g. Z2) of the second object are relatively deviated by a distance Wo when the first and second objects have no (zero) positional deviation W. This assures that, when the positional deviation W of the first and second objects is zero, the points C1 and C2 as well as the points C3 and C43 are spaced from each other.

The pattern arrangement of the first to fourth AA marks Z1–Z4 of FIG. 2 shows this. Namely, when the positional deviation of the first and second objects is zero, the optical axes of the first and second AA marks Z1 and Z2 (the optical axes of the third and fourth AA marks Z3 and Z4) are spaced by a distance Wo from each other.

Thus, when such patterns are used and when the first and second objects are deviated by a distance Wx, calculation may be done while substituting the quantity of deviation W in equations (9)–(12) by the following:

$$W=Wo+Wx$$

In this embodiment, in place of providing two AA marks on each of the first and second objects, four AA marks may be provided to produce four diffraction lights corresponding to the diffraction lights L3, L5, L7 and L9 described hereinbefore. Substantially the same advantageous effects may be assured.

Now, the manner of detecting the relative position of the first object (mask) 18 and the light projecting means (which may be alignment head 14 comprising the light source 1, the collimator lens 2 and the lens system 5), will be explained.

FIG. 6 shows that light 15 from the light projecting means is projected on the reference marks Z5, Z6 and Z7 and that the projected light is reflectively deflected (reflectively diffracted) and is received by the light receiving means 11. The reference marks Z5–Z7 each has a size of M in the Z direction and N in the Y direction. The reference marks Z5–Z7 each comprises a physical optic element such as a zone plane, for example, which has a function for directing a portion of the received light 15 to the light receiving means 11 (in this embodiment, it comprises the detecting means 11 (described hereinbefore) for detecting the relative position of the first and second objects 18 and 19).

Denoted at B1 is a reference line in the Z direction, and denoted at B2 is a reference line in the Y direction. The reference marks Z5–Z7 each is juxtaposed to the reference lines B1 and B2. When the reference lines B1 and B2 are aligned with the transverse center line and the longitudinal center line of the light 15, respectively, the relative alignment of the light projecting means (corresponding to the alignment head 14) and the first object (mask) 18 is accomplished.

In this embodiment, in the structure shown in FIG. 6, the reference marks Z5 and Z6 are scanned with the light 15 along the Z direction. Here, lights LZ5 and LZ6 reflectively diffracted by the reference marks Z5 and Z6 are incident on the light receiving means 11, comprising an array of sensor elements, at positions near the sensors 11Z5 and 11Z6. Changes, with scanning in the light quantity to be detected at the respective positions on the light receiving means 11, namely, changes in the light quantity distribution, are such as depicted by curves 71 and 72 in FIG. 7.

In FIG. 7, the axis of abscissa denotes the position coordinate in the scan direction of the light 15. When the transverse center line of the light 15 is aligned with the reference line B1, the lights LZ5 and LZ6 projected upon the light receiving means 11 from the reference marks Z5 and Z6 have the same light quantity.

In consideration of this, in this embodiment, the signal from the light receiving means 11 is processed by the signal processing circuit 3 and, on the basis of the result of this, the alignment head controller 9 moves the light projecting means (alignment head 14) in the Z direction so that the light 15 is placed at the position corresponding to the point P of intersection between the light quantity distributions 71 and 72 in FIG. 7. This is the Z-axis alignment.

As for the Y-axis alignment, in FIG. 6 the reference marks Z5 and Z7 are scanned with the light 15 in the Y direction. Here, lights LZ5 and LZ7 reflectively diffracted by the reference marks Z5 and Z7 are incident on the light receiving means 11 at positions near the sensors 11Z5 and 11Z7. Changes, with scanning in the quantity of light to be detected at the respective positions on the light receiving means 11, namely, changes in the light quantity distribution, are such as depicted by curves 81 and 82 in FIG. 8. When the longitudinal center line of the light 15 is aligned with the reference line B2, the lights LZ5 and LZ8 projected on the light receiving means 11 from the reference marks Z5 and Z7 have the same light quantity.

In consideration of this, in this embodiment, like the Z-axis alignment, the signal from the light receiving means is processed by the signal processing circuit 3 and, on the basis of the result of this, the alignment head controller 9 moves the light projecting means (alignment head 14) in the Y direction so that the light 15 is placed at the position corresponding to the point Q of intersection between the light quantity distributions 81 and 82. This is the Y-axis alignment. In this manner, relative alignment of the light projecting means and the first object 18 is assured in this embodiment.

It has been confirmed that, when the reference marks Z5–Z7 each has a size of M=50 microns and N=100 microns, a position detecting precision not larger than ±0.5 micron is assured.

FIG. 9 shows a second embodiment and illustrates the relationship between a reference mark and a light receiving means 11. This embodiment differs from the embodiment of FIG. 6 in the point that it uses only one reference mark Z5. In FIG. 7, the light quantity distribution curve 72 substantially corresponds to the light quantity distribution curve 71 if the latter is shifted by a distance M in the scan direction. Here, the distance M corresponds to the length of the reference mark in the Z direction, and it is determined beforehand.

Thus, the light quantity distribution curve 72 can be determined from the light quantity distribution curve 71, by calculation. This is also the case with the light quantity distribution curve 82 of FIG. 8, and it can be determined from the light quantity distribution curve 81 by calculation.

In consideration of this, in this embodiment, the light from only one reference mark Z5 is detected by the light receiving means 11, and light quantity distribution curves corresponding to the curves 72 and 82 of FIGS. 7 and 8 are detected. Subsequently, the other light quantity distribution curves 72 and 82 are determined by calculation. Then, on the basis of the point P (Q) of intersection between two light quantity distribution curves 71 and 72 (81 and 82), the alignment of the light projecting means and the first object 18 is assured in the same manner as the embodiment of FIG. 6.

A practical example of such a process may be that: light quantity distribution curves obtained at respective positions on the light receiving means 11 are stored into a memory and, by comparing the light quantity distribution curve 71 (81) at a particular position with the intensity distribution curve 72 (82) corresponding to the position spaced from the particular position by a distance M (N) and having been stored in the memory, the point P (Q) of intersection is determined.

In this embodiment, the reference mark comprises only one physical optic element. This reduces the area to be occupied by the scribe line. Also, manufacture is easier.

In this embodiment, the physical optic element of the reference mark Z5 may be replaced by a mere reflection surface. On that occasion, no diffraction light is produced from the reference mark Z5, and thus the reference mark Z5 does not have a function for controlling the direction of the light path. For this reason, the light receiving means 11 has to be disposed on the path of regular reflection light from the reference mark Z5. Using such a reflection-surface reference mark makes the manufacturing process simpler and assures higher reliability.

Next, a third embodiment of the present invention for detecting the relative position of a light projecting means and a first object, will be explained.

In an embodiment which uses the reference patterns of FIG. 6, from the light receiving means 11 as it scans the light in the Z direction, two curves 71 and 72 such as shown in FIG. 7 are obtainable with respect to two reference patterns Z5 and Z7. If, on such an occasion, similar signal processing as the second embodiment of the invention is executed to the two curves 71 and 72, respectively, then, with respect to the point P, two position coordinates are obtainable.

In the present embodiment, an average of such two position coordinates of the point P so obtainable is used to assure the position detection in the Z direction, with a reduced effect of noise. Also, from the light receiving means 11 as it scans the light in the Y direction, two curves 81 such as shown in FIG. 8 are obtainable with respect to the two reference patterns Z5 and Z6. By processing signals in the same manner as described and by using an average of two position coordinates of the point Q, the position detection in the Y direction is executed.

This embodiment may be so modified that: an additional reference mark Z8 comprising a physical optic element is provided in the first quadrant of the Y–Z plane shown in FIG. 6, in juxtaposition to the reference marks Z6 and Z7, such that, for the position detection in the Z direction, an average of two points P (i.e., the point P of intersection between the light quantity distribution curves based on the reference marks Z5 and Z6 and the point P of intersection between the light quantity distribution curves based on the reference marks Z7 and Z8) is used.

Also, for the position detection in the Y direction, an average of two points Q (i.e., the point Q of intersection between the light quantity distribution curves based on the lights from the reference marks Z5 and Z7 and the point Q of intersection between the light quantity distribution curves based on the lights from the reference marks Z6 and Z8) may be used.

In the embodiments described above, it is not always necessary that each reference mark is juxtaposed to the reference mark line. It may be disposed in juxtaposition to a separate line which is in a fixed positional relationship with the reference line.

Next, in a fourth embodiment of the invention, the manner of increasing the detection sensitivity by weighting the signal from the light receiving means 11 will be explained. As an example, if in place of the curves 71 and 72 of FIG. 7 such weighting as being represented by the following equations (a) and (b) is executed to the curves 71 and 72, then straight lines LA and LB such as shown in FIG. 10 are obtainable:

$$LA = (1000 \times Q1 + 200 \times Q2)/(Q1+Q2) \qquad \ldots (a)$$

$$LB = (200 \times Q1 + 1000 \times Q2)/(Q1+Q2) \qquad \ldots (b)$$

wherein Q1 is the light quantity at a point Pi on curve 71 of FIG. 7 and Q2 is the light quantity at a point Pi on curve 72 of FIG. 7. Also, the coefficients 1000 and 200 in equations (a) and (b) are arbitrary.

FIG. 10 illustrates the characteristic in the neighborhood of the point P of FIG. 7. As seen from FIG. 10, the point P of intersection in the Z direction between the two straight lines LA and LB corresponds to the point P of FIG. 7. The tilt of the two straight lines is large and, thus, in this embodiment the point P10 of intersection in the Z direction can be detected with higher precision. Also, as regards the detection of the point Q of intersection in the Y direction, like the Z direction it can be detected with higher precision by processing the curves 81 and 82 of FIG. 8 in a similar manner.

In the embodiments described above, the reference position is determined by comparing two light quantity distribution curves. Even if the light quantity of the light source used changes, the two light quantity distribution curves change similarly. Therefore, it does not substantially affect the precision of position detection and, consequently, high-precision position detection is assured constantly. Further, when a reference mark is provided by a physical optic element having an optical power, such as a zone plate, for example, highest precision position detection is assured.

The present invention is not limited to the embodiments described above. As an example, the invention may be applied to the relative positioning of an alignment head and a wafer. Further, the invention is not limited to the field of semiconductor devices, but it may be applied, for example, to the field of encoders, for detecting a reference position (origin) of scales.

Figure 11:
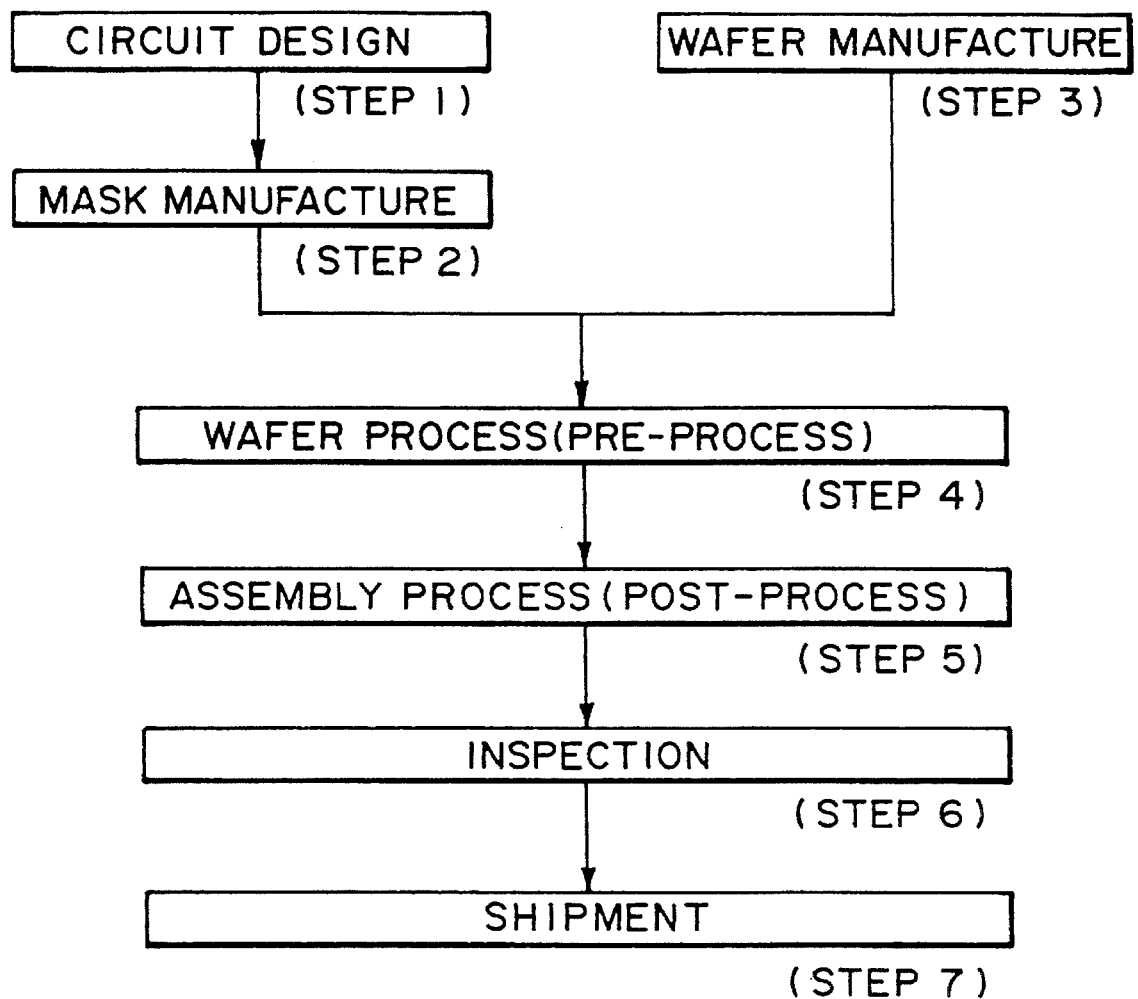
FIG. 11 is a flow chart of semiconductor device manufacturing processes.

FIG. 11 is a flow chart of the sequence of manufacturing a semiconductor device such as a semiconductor chip (e.g. IC or LSI), a liquid crystal panel or a CCD, for example. Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process which is called a pre-process wherein, by using the so prepared mask and wafer, circuits are practically formed on the wafer through lithography. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein an operability check, a durability check and so on of the semiconductor devices produced by step 5 are carried out. With these processes, semiconductor devices are finished and they are shipped (step 7).

Figure 12:
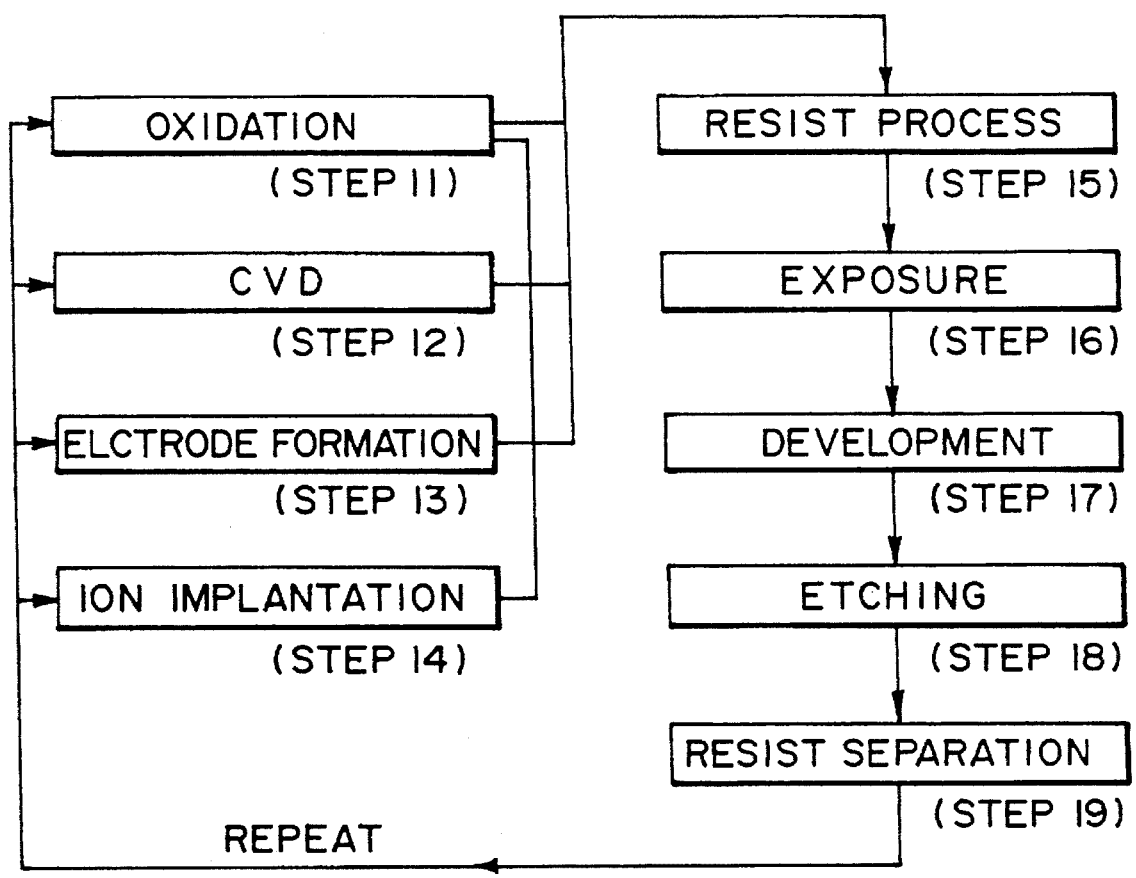
FIG. 12 is a flow chart of the wafer process.

FIG. 12 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. A position detecting system, comprising:

a light source for producing a light beam for irradiating a reference mark formed on an object, which is relatively displaceable with respect to the light beam;

a detector for detecting a light quantity distribution of the light from the reference mark; and circuit means comprising a first memory and a second memory, for storing, into said first memory, the light quantity distribution in relation to the relative position of the object and the light beam and for producing, from the data stored in said first memory, data corresponding to a light quantity distribution to be provided when the reference mark deviates by a predetermined distance, and for storing the produced data into said second memory, said circuit means determining the positional relationship between the object and the light beam on the basis of a comparison of the light quantity distributions stored in said first and second memories.

2. A system according to claim 1, wherein the reference mark has an optical power.

3. A system according to claim 1, wherein the object comprises a mask.

4. A position detecting method, comprising the steps of:

projecting a light beam to a reference mark formed on an object, which is relatively displaceable with respect to the light beam;

detecting a light quantity distribution of the light from the reference mark;

providing circuit means comprising a first memory and a second memory;

storing, into the first memory, the light quantity distribution in relation to the relative position of the object and the light beam;

producing, from the data stored in the first memory, data corresponding to a light quantity distribution to be provided when the reference mark deviates by a predetermined distance;

storing the produced data into the second memory; and determining, by the circuit means, the positional relationship between the object and the light beam on the basis of a comparison of the light quantity distributions stored in the first and second memories.

5. An exposure apparatus comprising:

a light source for producing a light beam for irradiating a reference mark formed on an object, which is relatively displaceable with respect to the light beam;

a detector for detecting a light quantity distribution of the light from the reference mark; and circuit means comprising a first memory and a second memory, for storing, into said first memory, the light quantity distribution in relation to the relative position of the object and the light beam and for producing, from the data stored in said first memory, data corresponding to a light quantity distribution to be provided when the reference mark deviates by a predetermined distance, and for storing the produced data into said second memory, said circuit means determining the positional relationship between the object and the light beam on the basis of a comparison of the light quantity distributions stored in said first and second memories.

6. A method of manufacturing semiconductor devices comprising the steps of:

projecting a light beam to a reference mark formed on an object, which is relatively displaceable with respect to the light beam;

detecting a light quantity distribution of the light from the reference mark;

providing circuit means comprising a first memory and a second memory;

storing, into the first memory, the light quantity distribution in relation to the relative position of the object and the light beam;

producing, from the data stored in the first memory, data corresponding to a light quantity distribution to be provided when the reference mark deviates by a predetermined distance:

storing the produced data into the second memory; and determining, by the circuit means, the positional relationship between the object and the light beam on the basis of a comparison of the light quantity distributions stored in the first and second memories.

* * * * *

UNITED STATES PATENT AND TRADEMARK OFFICE
CERTIFICATE OF CORRECTION

PATENT NO. : 5,455,679
DATED : October 3, 1995
INVENTOR(S) : SAKAE HOURYU, ET AL.

It is certified that error appears in the above-indentified patent and that said Letters Patent is hereby corrected as shown below:

COLUMN 1:

Line 13, "in" should read --on--.
Line 14, "where" should read --when--.

COLUMN 6:

Line 34, "y1=[(1+g)/(f1-g)-1]×W    ....(9)"

should read

--y1=[(L+g)/(f1-g)-1]×W    ....(9)--.

UNITED STATES PATENT AND TRADEMARK OFFICE
CERTIFICATE OF CORRECTION

PATENT NO. : 5,455,679
DATED : October 3, 1995
INVENTOR(S) : SAKAE HOURYU, ET AL.

It is certified that error appears in the above-indentified patent and that said Letters Patent is hereby corrected as shown below:

COLUMN 6:

Line 48, "D24-D={[L/(f2+)]+[L/(f4-g)]}×W ....(14)"

should read

--D24-D={[L/(f2+g)]+[L/(f4-g)]}×W ....(14)--.

COLUMN 8:

Line 3, "scanning" should read --scanning,--.
Line 26, "scanning" should read --scanning,--.

Signed and Sealed this

Fourteenth Day of May, 1996

Attest:

BRUCE LEHMAN

*Attesting Officer*     *Commissioner of Patents and Trademarks*